(12) United States Patent
Yang et al.

(10) Patent No.: US 7,362,787 B2
(45) Date of Patent: Apr. 22, 2008

(54) SELF-MODE-LOCKED SEMICONDUCTOR LASER

(75) Inventors: Weiguo Yang, East Windsor, NJ (US); Liming Zhang, Marlboro, NJ (US)

(73) Assignee: Lucent Technologies Inc., Murray Hill, NJ (US)

( * ) Notice: Subject to any disclaimer, the term of this patent is extended or adjusted under 35 U.S.C. 154(b) by 138 days.

(21) Appl. No.: 11/262,536

(22) Filed: Oct. 28, 2005

(65) Prior Publication Data

US 2007/0098031 A1  May 3, 2007

(51) Int. Cl.
*H01S 5/00* (2006.01)
(52) U.S. Cl. .............................. 372/45.012; 372/43.01; 372/18
(58) Field of Classification Search ............. 372/43.01, 372/18, 45.012
See application file for complete search history.

(56) References Cited

U.S. PATENT DOCUMENTS 6,195,375 B1   2/2001   Hirata .......................... 372/46

2003/0086654 A1* 5/2003 Saini et al. .................... 385/50
2004/0096175 A1* 5/2004 Tolstikhin .................... 385/131
2005/0259317 A1* 11/2005 Dagens et al. ............... 359/344

FOREIGN PATENT DOCUMENTS

EP   1 154 532 A2   11/2001

OTHER PUBLICATIONS

R. Paiella, F. Capasso, C. Gmachl, D. L. Sivco, J. N. Baillargeon, A. L. Hutchinson, A. Y. Cho, and H. C. Liu, "Self-mode-locking of quantum cascade lasers with giant ultrafast optical nonlinearities," Science, 290, 1739-1742 (2000).
Roberto Paiella et al., "Self-Mode-Locking of Quantum Cascade Lasers with Giant Ultrafast Optical Nonlinerities", www.sciencemag.org, Science, vol. 290, Dec. 1, 2000, XP-002424617.

* cited by examiner

*Primary Examiner*—Dung T. Nguyen

(57) ABSTRACT

An interband self-mode-locked (SML) semiconductor laser utilizes an active waveguide structure that includes an active waveguide section and one or more passive waveguide sections that together enhances self-mode-locking. The SML laser operation is based on enhanced Kerr lens mode-locking by vertically optically combining the active section with one or more passive waveguide sections.

10 Claims, 3 Drawing Sheets

SELF-MODE-LOCKED SEMICONDUCTOR LASER

FIELD OF THE INVENTION

The present invention relates to semiconductor lasers and more particularly to an interband self-mode-locked semiconductor laser.

BACKGROUND OF THE INVENTION

Electronically tunable, high repetition rate (>10 GHz) mode-locked semiconductor lasers can be viewed as an optical counterpart of the voltage controlled oscillators (VCOs) in electronic circuits, which are of fundamental importance for controlled high speed logic and digital communications. The research for such monolithically integrated mode-locked semiconductor lasers has been extensive ever since its onset about 15 years ago. In most cases, a short, reverse biased active section is used for saturable absorption. The use of ion implantation to form a saturable absorber was also investigated. These schemes involve more processing steps than ordinary laser diode fabrication. Self-mode-locked semiconductor lasers based on Kerr lens mode locking have been reported in quantum cascade lasers that utilizes intersubband electron transitions, which have large and ultrafast optical nonlinearities (see for example, the article by R. Paiella, F. Capasso, C. Gmachl, D. L. Sivco, J. N. Baillargeon, A. L. Hutchinson, A. Y. Cho, and H. C. Liu, "Self-mode-locking of quantum cascade lasers with giant ultrafast optical nonlinearities," Science, 290, 1739-1742 (2000)). This scheme may not need additional processing steps in fabrication and therefore is preferred. However, the inherent self-mode-locking effect in semiconductor lasers at 1.55 µm, which involves interband transitions rather than intersubband transitions, is much weaker. Recently, enhancement of weak self-mode-locking using picosecond-pulse injection has been reported in broad-area semiconductor lasers. What is needed is an improved self-mode-locked (SML) semiconductor laser that does not require additional processing steps in fabrication.

SUMMARY OF THE INVENTION

In accordance with the present invention, an interband self-mode-locked (SML) semiconductor laser utilizes an active waveguide structure that includes an active waveguide section and one or more passive waveguide sections that together enhance self-mode-locking. This scheme modifies minimally the laser diode fabrication process and provides shorter limits on laser cavity length, and therefore it pushes the limits on the pulse repetition rate. In one embodiment, a 1.56 µm self-mode-locked semiconductor lasers operates at a 40 GHz repetition rate. The SML laser is based on enhanced Kerr lens mode-locking by vertically combining the active section with one or more passive waveguide sections. The full-width-half-maximum (FWHM) width of the pulse spectrum is over 8 nm and the time domain pulse duration is about 10 ps. The average output power coupled to a cleaved fiber is over 0 dBm.

More particularly in accordance with the present invention, we describe a self-mode-locked semiconductor laser comprising an n+ Indium Phosphide (InP) substrate a P+ Indium Phosphide (InP) layer deposited on the n+ InP substrate, an active waveguide section embedded in the InP layer, and a first passive waveguide section embedded in the InP layer and separated from the MQW active waveguide section.

The active waveguide section may be implemented using a multiple quantum well (MQW) structure or using a bulk material. Other embodiments include forming the first passive waveguide section below or above the active waveguide section or adding a second passive waveguide section having one or more layers. The second passive waveguide section may also be located above or below the active waveguide section. Other embodiments vary. The index material used for the first and second passive waveguide sections can be selected from a group including Q1.1, Q1.2, and Q1.3 types of Indium Galium Arsinide Phosphide (InGaAsP) material.

BRIEF DESCRIPTION OF THE DRAWINGS

Other aspects, features, and advantages of the present invention will become more fully apparent from the following detailed description, the appended claims, and the accompanying drawings in which:

In the following description, identical element designations in different figures represent identical elements. Additionally in the element designations, the first digit refers to the figure in which that element is first located (e.g., 101 is first located in FIG. 1).

DETAILED DESCRIPTION

Figure 1:
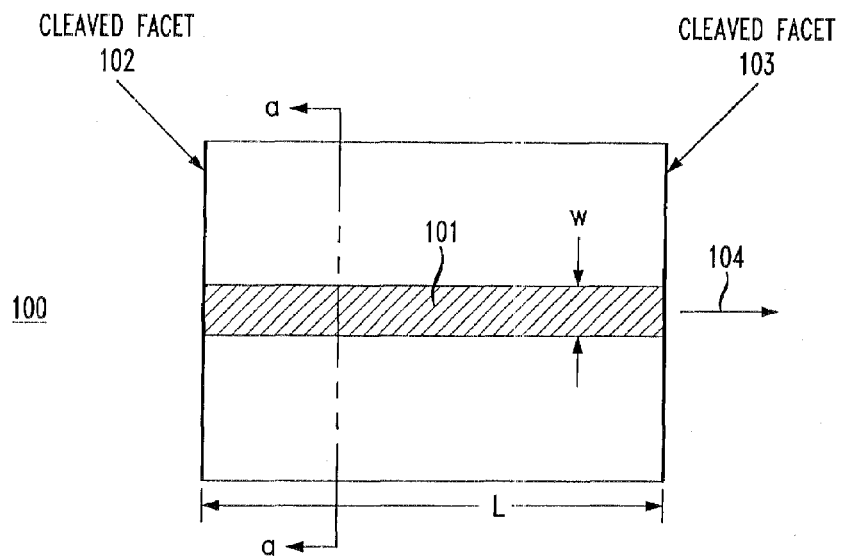
FIG. 1 shows a top view of a prior art edge-emitting index-guided semiconductor laser.

With reference to FIG. 1 there is shown a top view of a prior art edge-emitting index-guided semiconductor laser 100. The shaded area indicates the active waveguide 101. In the prior art such a laser was fabricated as an interband continuous wave (CW) laser or as an intersubband self-start self-mode locked (SML) laser. The laser cavity L is formed by two cleaved facets 102 and 103 and the laser frequency is determined by the length of cavity and the index of refraction of the waveguide. The cleaving of laser 100 is done after the laser 100 has been completely fabricated as will be discussed with reference to FIG. 2. The output of the edge-emitting laser 100 is emitted from the active multiple quantum wells (MQW) region and is shown by 104.

Figure 2:
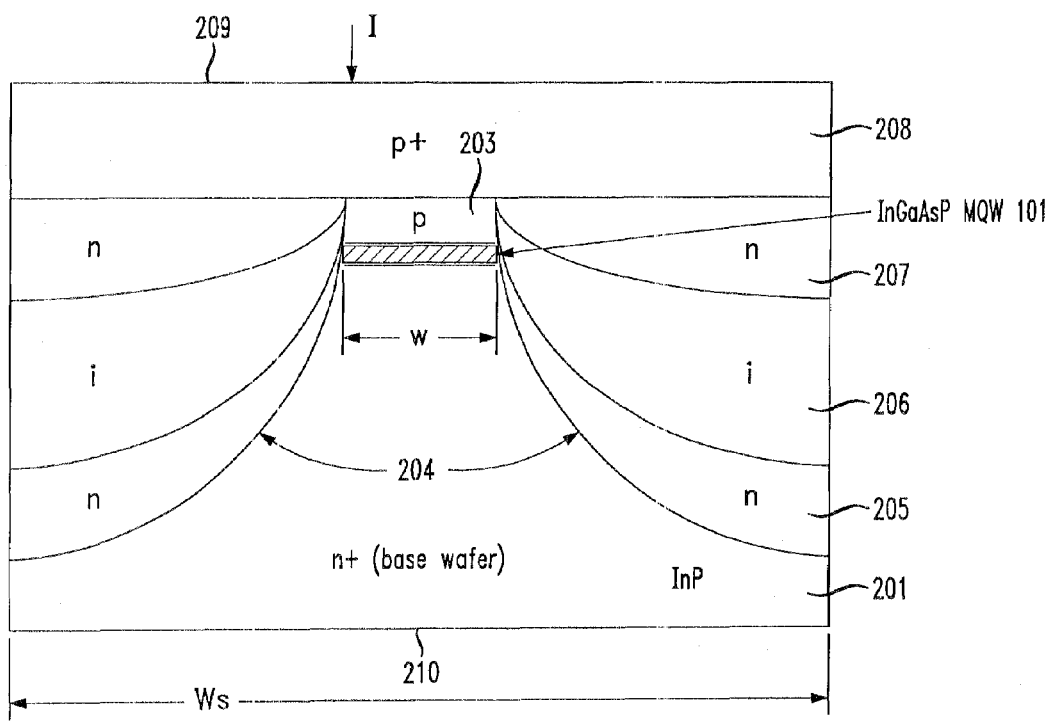
FIG. 2 shows an illustrative cross section view of section a-a of FIG. 1.

With reference to FIG. 2 there is shown an illustrative cross-section view of section a-a of FIG. 1. The CW laser 100 can be fabricated using a ridge-waveguide structure for weak index guiding or an etched-mesa for strong index guiding. Index-guided semiconductor laser fabrication is generally described in the book G. P. Agrawal, "Fiber-optic communication systems," John Wiley & Sons, Inc. (1992) at page 100-101, which description is incorporated by reference herein. FIG. 2 illustrates the waveguide structure for an etched-mesa CW laser 100. With reference to FIG. 2, the CW laser 100 is formed by depositing or epigrowing layers 101 and 203 across the entire width Ws of base wafer substrate 201. Base wafer substrate 201 is made of an n+ material, i.e., a heavily doped n-type Indium Phosphide (InP) semiconductor. Layer 101 is an Indium Galium Arsinide Phosphide (InGaAsP) multiple quantum wells (MQW) region and layer 203 is a p-type InP region. After layers 201, 101, and 203 are formed, a trench 204 is formed by a deep wet etch process until the MQW layer 101 forms an active waveguide region (or section) having a width W. Thereafter, an n-type InP layer 205, an i-type: semi-insulating iron doped InP layer 206, and a second 207 n-type InP layer 207 are sequentially epigrown to bury the active waveguide region. A p+ region of heavily doped p-type InP is then deposited as layer 208 across the entire base wafer width Ws. Contacts are then formed on surfaces 209 and 210. To operate the laser, a direct current I (dc) is applied across contacts 209 and 210 and the edge-emitting laser output 104 is outputted from the cleaved edge 103 of the active waveguide region 101.

Figure 4:
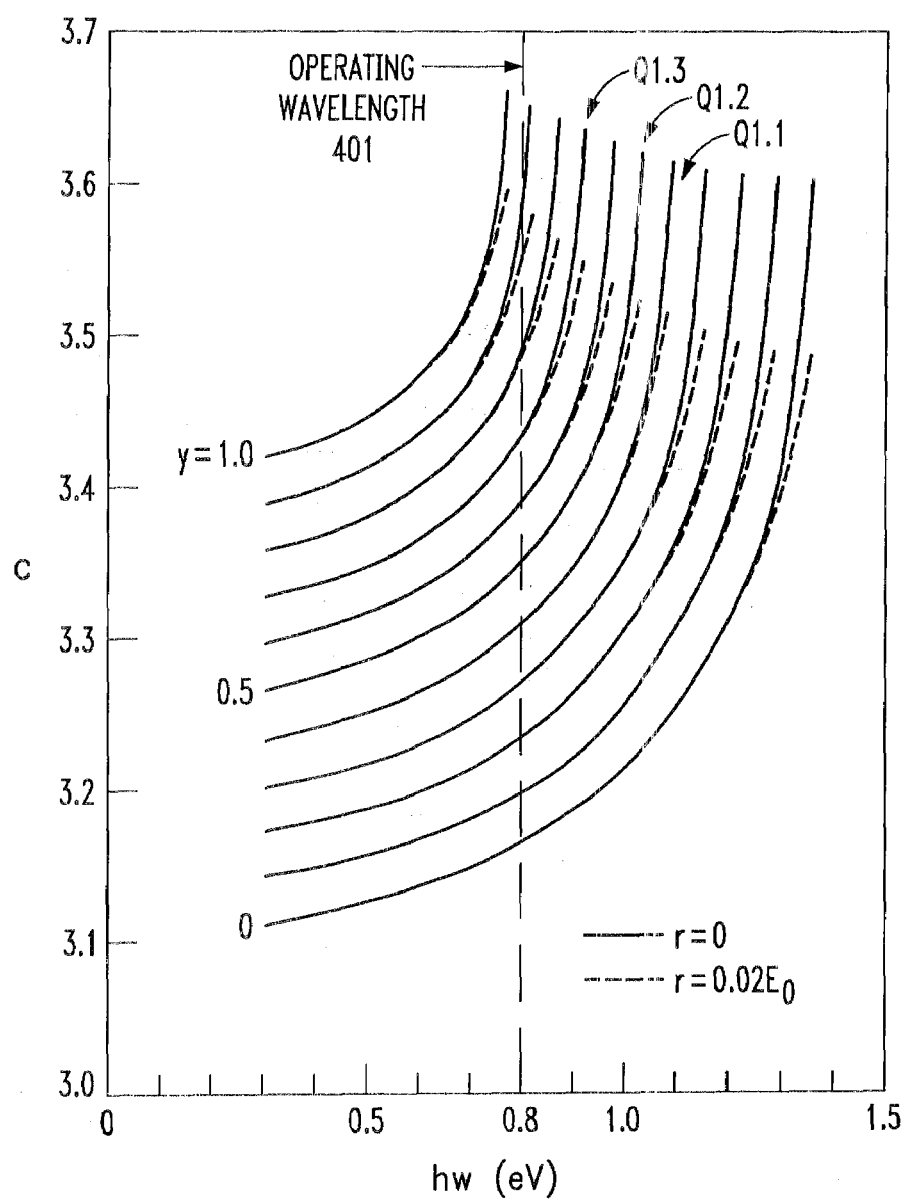
FIG. 4 shows calculated refractive indicies of $In_{1-x}Ga_x As_y P_{1-y}$ as a function of the photon energy with y-composition increments of 0.1.

The previously-referenced intersubband self-start self-mode locked (SML) laser can be fabricated in a similar manner. The waveguide structure fabrication and operation of such an intersubband self-start self-mode locked (SML) laser is described in the above-referenced R. Paiella, et al article which description is incorporated by reference herein. In the R. Paiella, et al article, the cross-section view of the etched-mesa type fabrication of an intersubband SML laser is shown in FIG. 4. The laser includes an active waveguide region that utilizes intersubband electron transitions, i.e., transitions between quantized conduction-band states, to generate an ultrashort SML laser signal.

Figure 3:
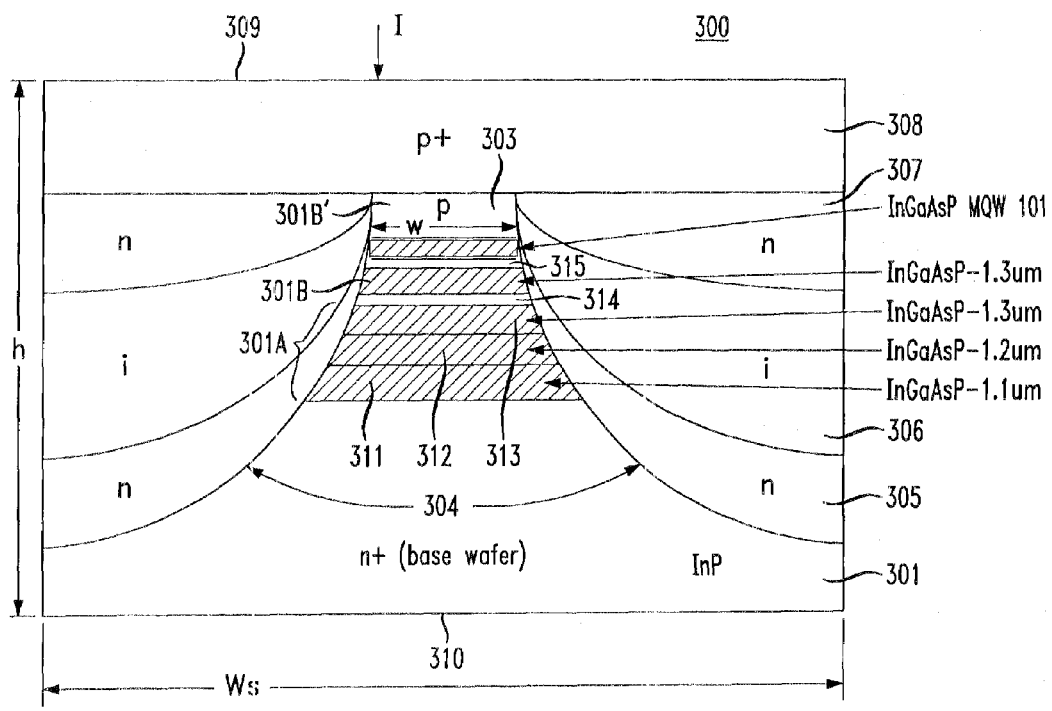
FIG. 3 shows, in accordance with the present invention, an illustrative cross section view of an interband self-mode-locked (SML) semiconductor laser.

FIG. 3 shows, in accordance with the present invention, an illustrative cross-section view of one embodiment of our interband SML semiconductor laser 300. The top-view of our interband SML laser would appear as shown in FIG. 1. Our interband SML laser uses etched-mesa fabrication, basically utilizing the same fabrication steps recited in the previously described CW laser, which is shown in FIG. 2. Unlike the CW laser, however, our interband SML laser includes both an active MQW section 101 and at least one separated passive waveguide section (two passive waveguide section, 301A and 301B are shown in FIG. 3). This particular embodiment of our interband SML laser includes two passive waveguide sections, 301A (thickness of about 300 nm) and 301B (thickness of about 100 nm), separated by an InP layer 314. Other interband SML laser embodiments may include the passive waveguide sections (e.g., 301A and 301B) located above or below the active MQW section 101. When only one passive waveguide section, e.g., only 301B, is utilized, that one passive waveguide section (with modified thickness about 300 nm ) may be located below and separated by an InP layer 315 (thickness about 15 nm) from the active MQW section 101, as shown in FIG. 3, or located above the active MQW section 101 (at the illustrative position shown by marker 301B' in FIG. 3). The position shown by marker 301B' illustrates that the one passive waveguide section would be located above and separated by an InP layer (thickness about 15 nm) from the active MQW section 101 and below. When only one passive waveguide section is used, the material would be Q1.3 index material (InGaAsP—1.3 μm).

While the invention is described with the active waveguide section 101 using a MQW structure, it should be understood that a bulk material structure could also be used as the active waveguide section 101. This bulk material is selected according to the desired wavelength of operation.

For example, if it is desired to operate at a wavelength of 1.55 um the bulk can be Q1.55. If however the desired operation wavelength is 1.3 um, then the bulk can be Q1.3 and the passive material structures have to be shifted in the same direction accordingly, for example, section 301B should be in the range of Q1.1 to Q1.2 and the layers of section 301A should be in the range of Q1.0 to Q1.2.

Additionally, when only one passive waveguide section 301B is used, that section may include one, two or three adjacent layers. Thus, if only one passive waveguide section 301B is used and it has three adjacent layers, the three layers would be arranged as presently shown in section 301A. The index material used for the three layers is selected from a group including Q1.1, Q1.2, and Q1.3 index material, where the index of Q1.1 (InGaAsP—1.1 μm) is less than Q1.2 (InGaAsP—1.2 μm) which is less than Q1.3 (InGaAsP—1.3 μm) and where the layer closest to the MQW active section 101 must have a greater index value. In such an embodiment the thickness of the Q1.1, Q1.2, and Q1.3 index material would be 100 nm, 100 nm, and 100 nm, respectively. If two passive waveguide sections are used, the first passive waveguide section being closer to the MQW active section 101 (section 301B as shown in FIG. 3) than the second passive waveguide section, then only the second passive waveguide section may have multiple layers (311, 312, and 313). These multiple layers of the second passive waveguide section would all be arranged so that the passive waveguide layer closest to the first passive waveguide section has the highest index and where the index is smaller for any lower adjacent layer that is further from the first passive waveguide section. Thus for example in FIG. 3, the second passive waveguide section 301A has three adjacent layers 311, 312, and 313 where section 313 is the passive waveguide layer closest to the first passive waveguide and, hence, has the highest index Q1.3 and where the next closest passive waveguide layer 312 has the index Q1.2 and where the furthest passive waveguide layer 311 has the index Q1.1. It should be noted that in a two passive waveguide sections embodiment, as shown in FIG. 3, the index of the single layer of the first passive waveguide section 301B has an index Q1.3 that is equal to or greater than the index Q1.3 of the first layer 313 of the second passive section 301A.

With continued reference to FIG. 3, we describe the fabrication of the preferred embodiment of our interband self-start mode locked (SML) laser that includes two passive waveguide sections 301A and 301B. The base wafer substrate 301 is made of an n+ InP material, i.e., a heavily doped n-type Indium Phosphide (InP) semiconductor of a thickness 100 to 500 um . The passive waveguide section 301A is shown to include three layers 311, 312, and 313. The first layer 311 of index Q1.1 (InGaAsP—1.1 μm) material is epigrown onto (adjacent) the base wafer substrate 301. Thereafter, the second layer 312 of index Q1.2 (InGaAsP—1.2 μm) material is epigrown directly onto the first layer 311 and then the third second layer 313 of index Q1.3 (InGaAsP—1.3 μm) material is epigrown directly onto the second layer 312. Illustratively, these three layer 311, 312, and 313 have a thickness of 115 nm, 115 nm, and 120 nm, respectively. Generally the three layers 311, 312, and 313 have the same thickness.

A layer 314 of InP material of thickness 15 nm is then epigrown onto the layer 313 and then the passive waveguide section 301B of index of Q1.3 (InGaAsP—1.3 μm) material of thickness 105 nm is epigrown onto layer 314. Thereafter, another layer 315 of InP material of thickness 15 nm is epigrown onto the passive waveguide section 301B. The Indium Galium Arsinide Phosphide (InGaAsP) multiple quantum wells (MQW) active waveguide section 101 is then fabricated onto layer 315. This MQW active waveguide section 101 can have a thickness of about 80 nm and include multiple quantum wells (illustratively 18 nm). A p-type InP region 303 of thickness 650 nm is then deposited onto the MQW active waveguide section 101. All of the above fabrications are made across the entire width Ws so that the dimensions of the device is H×Ws (e.g., dimension 1 mm by 0.5 mm). The next step involves etching a trench 304 by using a deep wet etch until the MQW layer 101 has a width about 1 um (shown in FIG. 1). Thereafter, an n-type InP layer 305, an i-type: semi-insulating iron doped InP layer 306, and a finally a second n-type InP layer 307 are sequentially deposited on the flanks 204 of the trench to bury the active MQW waveguide region 101. The regrowth must be grown up to the top of the p layer 303. A p+ region of heavily doped p-type InP of thickness 2 um is then deposited as layer 308 across the entire base wafer width Ws. Contacts are then formed on surfaces 309 and 310. After the interband SML laser structure 300 is fabricated as described above, it is then cleaved along its edges (102 and 103 of FIG. 1) to form the desired laser cavity length (L of FIG. 1). After fabrication our SML laser 300 appears as an n+ Indium Phosphide (InP) substrate that has a p+ Indium Phosphide (InP) layer deposited on the n+ InP substrate with both a multiple quantum well (MQW) active waveguide section embedded in the InP layer and a first passive waveguide section embedded in the InP layer and separated from the MQW active waveguide section. While our interband SML laser 300 has been described as being fabricated using wet etched-mesa technique, other fabrication techniques such as dry etching may be utilized.

Figure 5:
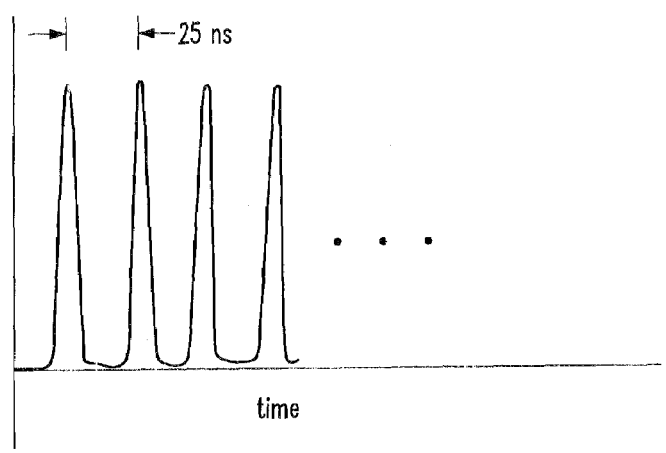
FIG. 5 shows illustrative pulse repetition rate of our interband SML laser of FIG. 3.

To operate the interband SML laser 300, a direct current I (dc) is applied across contacts 309 and 310 and a mode-locked pulse train signal 104 is emitted from the cleaved edge 102 and 103 of the active waveguide region 101. As shown in FIG. 5, the repetition rate of the mode-locked pulse train is 40 GHz which in the time domain corresponds to a pulse separation of 25 ns. This repetition rate is determined by the length of cavity (L of FIG. 1) and the index of refraction of the effective active waveguide structure formed by MQW active waveguide section 101 and the two passive waveguide sections 301A and 301B. Since our arrangement provides shorter limits on laser cavity length (L of FIG. 1), it therefore increases the upper limit of the repetition rate of the mode-locked pulse train.

The general operation of our interband SML laser is described with reference to and to distinguish over the intersubband laser described in the previously referenced R. Pailla et al article. The ultra short mode-locked pulses are generated by locking the longitudinal modes of the laser cavity (L of FIG. 1) in phase, by some external or internal mechanism, to produce a train of pulses with a repetition rate equal to the cavity roundtrip frequency (40 GHz in our example). The short mode-locked pulses are based on interband electron transitions, i.e., transitions between conduction-band and valence-band states in our MQW active waveguide section. The self-mode-locking (SML) characteristic derives from the nonlinearities, the intensity-dependent refractive index (often referred to as the optical Kerr effect) of the interband electron transitions. The refractive index varies in a nonlinear manner with the optical intensity.

FIG. 4 is the index of refraction curves of different InGaAsP material as shown in FIG. 8.27 of S. Adachi, "Physical properties of III-V semiconductor compounds", John Wiley & Sons, Inc. (1992). FIG. 4 shows calculated refractive indicies of $In_{1-x}Ga_xAs_yP_{1-y}$ as a function of the photon energy (hw) with y-composition increments of 0.1. The solid and dashed lines represent, respectively the ideal case and the case with moderate damping factor. The various index material Q1.1, Q1.2, and Q1.3 used for the passive waveguide sections 301A and 301B as well as SML operating wavelength 401 are indicated on FIG. 4. As shown in FIG. 4, the Q1.3 layer is the most important layer of the passive waveguide section 301A, because the band gap is the closest to the operating wavelength 401. Also, the biasing current I changes waveguide index due to carrier effect, therefore, the cavity length can be fast tuned in the relatively large range of about 1%.

The combination of the active section (MQW active waveguide section 101) together with the passive sections 301A and 301B together form our SML laser 300. The MQW active waveguide section 101 provides gain and the passive waveguide structure (passive sections 301A and 301B) enhances Kerr lens effects, and, therefore, facilitates self-mode-locking. Both active 101 and passive sections 301A, 301B are buried in the base material, i.e., InP. The passive waveguide structure 301A and 301B, which occupies a much larger portion of the total active waveguide structure, enhances Kerr lens effect, and therefore enhances self-mode-locking. The passive waveguide illustratively consists of a graded-index quaternary layers with band edges from 1100 nm (Q1.1 material), 1200 nm (Q1.2 material) to 1300 nm (Q1.3 material). The MQW section 101 of FIG. 3 illustratively uses 4 compressively strained quantum wells strain compensated by symmetric tensile barriers. It should be noted that the active section 101 can be made by using either quantum well structure (MQW) or bulk to provide optical gain. The SML laser diode 300 is about 1 mm long (L of FIG. 1) to produce a 40 GHz repetition rate and has a width W (FIG. 1) of 100 um (Actual width of the device is not important, the critical width is the width of 101, the active waveguide, which in our case is about 1 um).

The resulting interband SML laser modifies minimally the laser diode fabrication process and provides shorter limits on laser cavity length L, and therefore it pushes the limits on the pulse repetition rate. In one embodiment, a 1.56 um wavelength self-mode-locked semiconductor laser operates at a 40 GHz repetition rate. Our interband SML laser exhibits enhanced Kerr lens mode-locking effect by vertically combining the active section with one or more passive waveguiding sections. The FWHM width of the pulse spectrum is over 8 nm and the time domain pulse duration is about 10 ps. The average output power of mode-locked pulse train 104 coupled to a cleaved fiber is over 0 dBm.

Various modifications of the described embodiments, as well as other embodiments of the invention, which are apparent to persons skilled in the art to which the invention pertains are deemed to lie within the principle and scope of the invention as expressed in the following claims.

Although the steps in the following method claims, if any, are recited in a particular sequence with corresponding labeling, unless the claim recitations otherwise imply a particular sequence for implementing some or all of those steps, those steps are not necessarily intended to be limited to being implemented in that particular sequence.

We claim:
1. A self-mode-locked semiconductor laser, comprising:
an n+ Indium Phosphide (InP) substrate,
a p+ Indium Phosphide (InP) layer deposited over the n+ InP substrate,
an active waveguide section embedded between the InP layer and the InP substrate, and a first passive waveguide section embedded between the InP layer and the InP substrate and separated from the active waveguide section, wherein the first passive waveguide section is adapted to contribute to self mode locking via a Kerr lens effect.

2. The self-mode-locked semiconductor laser of claim 1, wherein the active waveguide section is a multiple quantum well (MQW).

3. The self-mode-locked semiconductor laser of claim 1, wherein the active waveguide section is a bulk material.

4. The self-mode-locked semiconductor laser of claim 1, wherein the first passive waveguide section comprises InGaAsP adapted to produce photoluminescence at about 1.3 μm.

5. The self-mode-locked semiconductor laser of claim 1, wherein the first passive waveguide section is embedded between the active waveguide section and the InP substrate.

6. The self-mode-locked semiconductor laser of claim 1, further comprising a second passive waveguide section separated from the first passive waveguide section, the second passive waveguide section including one or more passive waveguide layers, wherein the second passive waveguide section is adapted to further contribute to said self mode locking via the Kerr lens effect.

7. The self-mode-locked semiconductor laser of claim 1, wherein:
the first passive waveguide section is embedded between the active waveguide section and the InP substrate; and
the second passive waveguide section is embedded between the first passive waveguide section and the InP substrate.

8. The self-mode-locked semiconductor laser of claim 6, wherein:
the first passive waveguide section comprises InGaAsP adapted to produce photoluminescence at about 1.3 μm; and
the second passive waveguide section comprises InGaAsP adapted to produce photoluminescence at about 1.1, 1.2, or 1.3 μm.

9. The self-mode-locked semiconductor laser of claim 6, wherein the second passive waveguide section includes a plurality of adjacent passive waveguide layers and where the passive waveguide layer closest to the first passive waveguide section has the highest index and where the index of any succeeding adjacent layer decreases the further that layer is from the first passive waveguide section.

10. The self-mode-locked semiconductor laser of claim 6, wherein:
the first passive waveguide section is separated from the active waveguide section by a first intermediate layer; and
the second passive waveguide section is separated from the first passive waveguide section by a second intermediate layer.

* * * * *